United States Patent
Billi et al.

(10) Patent No.: US 6,749,738 B2
(45) Date of Patent: Jun. 15, 2004

(54) ELECTROCHEMICAL METHOD FOR FORMING AN INORGANIC COVERING LAYER ON A SURFACE OF A COPPER MATERIAL

(75) Inventors: Alberto Billi, Gallicano (IT); Stephan Hoveling, Osnabruck (DE); Stefan Priggemeyer, Wallenhorst (DE)

(73) Assignee: Europa Metalli S.p.A., Florence (IT)

( * ) Notice: Subject to any disclaimer, the term of this patent is extended or adjusted under 35 U.S.C. 154(b) by 0 days.

(21) Appl. No.: 10/107,596

(22) Filed: Mar. 27, 2002

(65) Prior Publication Data

US 2003/0102227 A1 Jun. 5, 2003

Related U.S. Application Data

(63) Continuation of application No. PCT/IT99/00307, filed on Sep. 29, 1999.
(51) Int. Cl.[7] .............................. C25D 11/00; C25D 9/00
(52) U.S. Cl. .................. 205/333; 205/316; 205/323; 205/324
(58) Field of Search .................. 205/316, 333, 205/317, 318, 319, 320, 321, 322, 323, 324, 326

(56) References Cited

U.S. PATENT DOCUMENTS 5,078,844 A * 1/1992 Katsuma ................ 205/149

FOREIGN PATENT DOCUMENTS

DD  131044      5/1978
GB  1052729    12/1966

* cited by examiner

Primary Examiner—Wesley A. Nicolas
(74) Attorney, Agent, or Firm—Ladas & Parry

(57) ABSTRACT

A method is provided for forming an inorganic layer on a surface of a copper material, made of copper or of a copper-based alloy: a browning anodic oxidation process is performed on the copper material in an electrolytic bath containing only an alkali (for example NaOH) at a specified concentration in aqueous solution, under controlled condition of temperature and anodic current density and for a period of time suitable to form a continuous layer basically formed of copper (I) oxide ($Cu_2O$): layers highly adherent to the copper substrate and having good mechanical behavior are produced: different colors and optical properties may be obtained by controlling the process conditions so as to influence the crystalline form of the $Cu_2O$ layers.

15 Claims, 5 Drawing Sheets

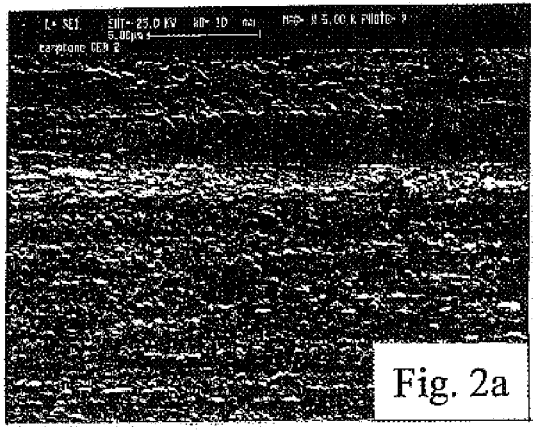
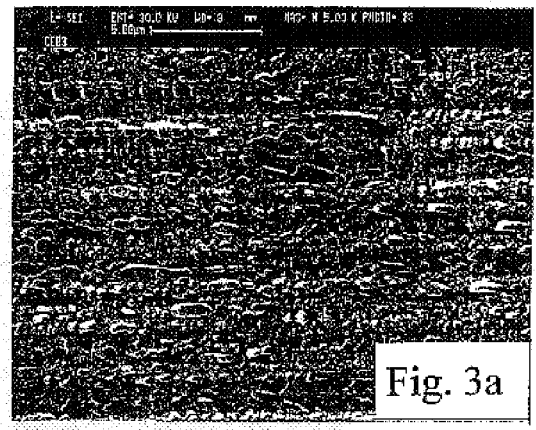
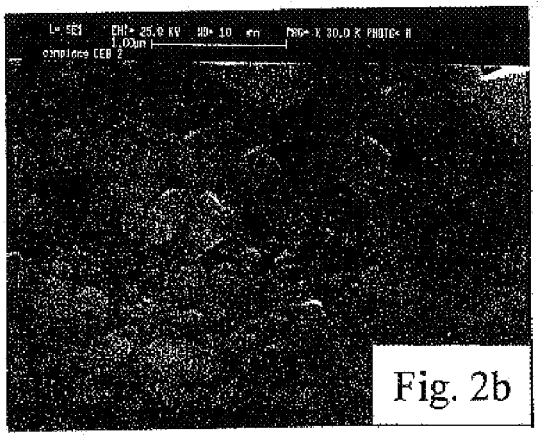
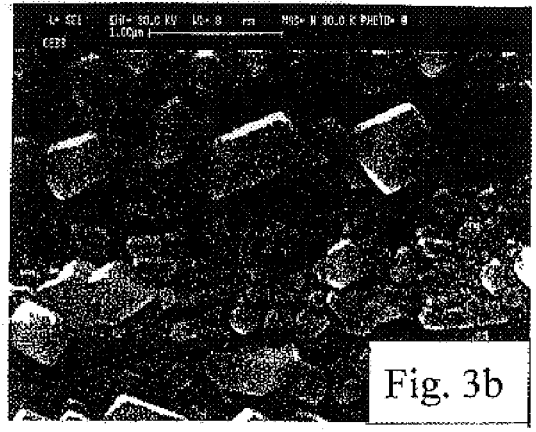
Fig. 2a
Fig. 3a
Fig. 2b
Fig. 3b

ELECTROCHEMICAL METHOD FOR FORMING AN INORGANIC COVERING LAYER ON A SURFACE OF A COPPER MATERIAL

This application is a continuation of co-pending International Application PCT/IT99/00307 filed Sep. 29, 1999, which designates the U.S., claims benefit thereof and incorporates the same by reference.

TECHNICAL FIELD

The present invention relates to an improved electrochemical method for forming an inorganic covering layer, having specified optical, chemical and mechanical characteristics, on a surface of a copper material; the invention further relates to a copper article, made of a copper or copper-based alloy material at least in a surface thereof, comprising an inorganic covering layer having specified optical, chemical and mechanical characteristics.

BACKGROUND ART

It is known that copper or copper-based alloy materials require, in many different applications, to be covered by a layer having specific characteristics. Different applications usually require different features of the covering layer: for example, good electrical insulating properties are essential in wire protection, optical properties (reflectance, gloss, etc.) are vital in solar energy collectors, a particular aesthetic appearance and a particular colour are important in roofing and building construction in general; in any case, the layer should be as adherent as possible to the copper material (in order to avoid a possible detachment during the production process or in use) and have good mechanical characteristics.

A variety of methods has heretofore been proposed for the formation of different kinds of coating layers on copper material surfaces. In particular, chemical conversion or anodizing process are known. In chemical conversion, the copper material to be treated is dipped at a high temperature in an electrolytic bath comprising an alkali salt at a high concentration and an oxidizing agent, in order to form a copper(II) oxide (cupric oxide, CuO) layer: this method requires not only a long process time but also a rather high cost for the reagents and its productivity is therefore poor. In traditional anodizing (i.e. anodic oxidation), a layer composed of copper(II) oxide CuO is formed on a copper material at a high current density in a alkaline solution of a high concentration: since CuO thus formed is instantaneously redissolved even by a slight variation in process conditions (alkali concentration, current density), the process control is extremely difficult.

Improved anodizing processes are disclosed in U.S. Pat. Nos. 5,078,844 and 5,401,382: a tough electrically insulating layer is formed on a copper surface by anodizing at low current density in an acidic electrolytic bath of a hexacyanoiron complex; eventually, such an anodic oxidation process may be preceded by a further anodizing in an alkaline electrolyte bath of a caustic alkali to form a thin film layer of cupric oxide CuO. These methods provide efficient production of insulating composite layers made of copper(I) oxide and copper hexacyanoferrate(I) or (II), but they require relatively long process time and cost and, furthermore, the layers are not suitable for many applications, in particular where specified colour, aesthetic appearance and optical features are required. It is also known from EP-A-751233 a browning method for forming a dark brown covering layer on a copper strip or sheet to be used, for example, in roof covering: the copper material is heat-treated at high temperature (250÷750° C.) in a mixed gas atmosphere containing $O_2$ to form a cuprous oxide ($Cu_2O$) layer conditions or, alternatively, treated with an aqueous alkaline solution to form a cupric oxide (CuO) layer: in both cases the final covering layer consists of a first layer made of $Cu_2O$ adhering to the base metal and a second layer made of CuO over the first layer. This method requires a high contact time in order to form the composite covering layer and it also has relatively high production costs, basically due to a reduced chemical stability of some oxidants and to higher costs of waste treatment, which are essential in order to avoid water and air pollution.

From GB 1052729 a method is known of anodic oxidation of the surface of a copper sheet in an alkaline aqueous solution, e.g. a solution of NaOH or KOH, under certain process conditions but, always at current densities below 0.5 A, thus resulting only in a predominantly golden-yellow to golden red coating $Cu_2O$.

This patent do not provide a method of anodic oxidation to form a continuous homogeneous layer formed of copper (I) oxide (cuprous oxide, $Cu_2O$) to obtain different colours by varying specific parameters.

DISCLOSURE OF INVENTION

It is an object of the present invention to provide an improved electrochemical method for forming a covering layer on a copper surface which allows the aforementioned disadvantages connected with the known processes to be eliminated. In particular, it is object of the present invention to provide a fast, simple and inexpensive method which is really effective in providing a copper surface with a coating layer having specified colour, aesthetic appearance and optical properties, improved adherence to the copper substrate and excellent mechanical characteristics by varying the current densities.

According to the present invention, there is provided an electrochemical method for producing an inorganic covering layer on a surface of a copper or copper-based alloy element, characterized in that it comprises an anodic oxidation of said element, in which said surface is placed in an alkaline electrolytic bath of at least an alkali in aqueous solution under controlled process conditions of temperature and current density and for a period of time suitable to form a continuous substantially homogeneous layer on said surface, said layer being basically formed of copper(I) oxide (cuprous oxide, $Cu_2O$) having a crystalline structure and a consequent colour determined by said controlled process conditions. In particular, the anodic oxidation is performed in a bath containing only a single alkali salt in aqueous solution, preferably at a concentration of about 1,25÷11,25 mole/l of hydroxyl ion (for example, sodium hydroxide NaOH at a concentration of about 50÷450 g/l or potassium hydroxide KOH at a concentration of about 70÷630 g/l).

Preferably, the anodic oxidation is performed in a bath containing at least 20% wt. sodium hydroxide in aqueous solution, at a temperature of at least 60° C., at a current density of 0,5÷20 A/dm$^2$ with a cell potential (anode/cathode potential difference) of about 0,2÷3 V and for a period of time of about 5÷120 seconds. More preferably, the anodic oxidation is performed in a bath of 30% wt. NaOH in aqueous solution, at a temperature of about 82°÷92° C. and for a period of time of about 10÷30 seconds, suitable for obtaining a layer having a thickness of about 0,100÷0,400 μm. The final colour of the layer is determined by varying the current density in said alkaline electrolytic bath in the range $0,3 \div 20$ A/dm$^2$: in particular, the anodic oxidation is performed at a current density of about $0,5 \div 1$ A/dm$^2$ to form a layer having a brown colour, at a current density of about $2,5 \div 3$ A/dm$^2$ to form a layer having a dark brown colour, at a current density of about $10 \div 15$ A/dm$^2$ to form a layer having a deep black colour and a velvety surface effect.

The method according to the invention may further comprise, before the anodic oxidation process, a pre-treatment step of the copper surface (for example a chemical or thermal pre-oxidation, a skin passing process, a benzotriazole inhibition, etc.), as well as, after the anodic oxidation, a final surface treatment (for example a further skin-passing step).

According to an embodiment of the invention, the anodic oxidation starts as soon as the copper surface is placed in contact with the electrolytic bath; as an alternative, the anodic oxidation starts a period of time of about $3 \div 180$ seconds after the copper surface is placed in contact with the electrolytic bath.

In case the copper or copper-base alloy element is a plate-like element, both surfaces of said element may be simultaneously subjected to the anodic oxidation according to the invention. Clearly, the method of the invention is absolutely not limited to a plate-like article, but it can be applied to articles having substantially any shape and geometry.

The present invention further relates to a copper article, made of a copper or copper-based alloy material at least in a surface thereof, characterized in that it comprises a continuous substantially homogeneous covering layer (preferably having a thickness of about $0,100 \div 0,400$ μm) on said surface, said layer film being basically formed of copper(I) oxide (cuprous oxide, $Cu_2O$) having a defined crystalline structure for giving to said surface specific optical properties.

The basis of the present invention is therefore to be seen in conducting, in a traditional electrolytic cell, an anodic oxidation of a copper surface under controlled condition, so as to form basically cuprous oxide $Cu_2O$ and avoid the formation of cupric oxide CuO: the process of the invention can be therefore considered an improved electrochemical browning process which overcomes all the drawbacks of the above-mentioned known processes: in fact, only an alkaline solution (for example an aqueous sodium hydroxide solution, extremely cheap) and electrical current (with a relatively low consumption) are used in the method according to the invention: the desired layer is produced by electrochemistry avoiding the use of chemical oxidants and/or other expensive reagents: just a very short contact time is required (significantly shorter than in known processes), so that the whole process is faster, simpler and less expensive than known processes. The method can be defined a "zero-waste" process, since the consumption of chemicals involved in the process is extremely low and may be further limited by using, for example, vacuum or inverse osmosis concentrators. Also environmental impact is reduced when compared with known processes.

Any known electrochemical apparatus may implement the method according to the invention: as previously stated, the electrolytic bath contains only an alkali, preferably sodium hydroxide (very inexpensive), and demineralized water: no additives or other chemicals are required, as in other known browning processes.

The coloured final layers are basically made of pure crystalline copper(I) oxide $Cu_2O$ containing traces of copper (II) oxide CuO, as revealed by chronopotentiometric analysis (a branch of coulometry). $Cu_2O$ layers offers, when compared to CuO layer, many advantages: they are more adherent to the copper substrate and show a better mechanical behaviour, allowing any detaching problem to be avoid, both during mechanical treatment and in use; they show a better leaching resistance to acid rains and to atmospheric conditions in general; they have superior optical properties and a more pleasant aesthetic appearance, being able to assume a brown colour with desired intensity and shade; they have good insulating properties, realizing an effective barrier to metallic diffusion, and are scarcely influenced by heat and nuclear radiation. The method according to the invention allows different colours to be obtained, simply controlling the anodizing process condition (mainly current density) and consequently the crystalline form of the oxide layer: even a velvety deep black layer may be obtained, showing improved optical properties when compared, for example, to black chromium (which is traditionally used, as well known, to cover copper sheets by electroplating for solar energy applications).

The method according to the invention is particularly useful to produce very uniform coloured thin layers on copper continuous strips and single sheets (on both sides thereof), but it may also be used on copper articles having any shape: the method may be easily implemented either in a continuous or in a batch industrial process. The method of the invention may be applied to any kind of copper base material: for example, pure copper, copper-base alloys (brasses and bronzes), either pre-treated (e.g. thermally or chemically pre-oxidized, skin-passed, benzotriazole inhibited) or not: no pre-cleaning treatments, as degreasing and pickling, are necessary. Copper surfaces realized according to the present invention can be used in a wide range of industrial applications, thanks to the above described favourable features: in particular (but not only), the method of the invention allows an easy, fast and inexpensive production of rolled strips or sheets for roofing (standard or energetic roofing), ornamental articles to be used in building construction, pre-oxidized copper foils for electronics or oxidized copper surfaces of inner layers in electronic circuits (blackening), heat collectors for solar energy applications (instead of traditional high expensive black chromium electroplated copper surfaces); the method can also be used for covering cylindrical geometry surfaces, such as wire, bars, tubes and mineral insulated electrical cables, with copper sheathing, as well as for in electrical insulation of copper wires and superconductor cables, in which case the anodizing process may be prolonged for a time suitable to produce CuO instead of $Cu_2O$.

As previously stated, the anodizing process according to the invention may be preceded by a pre-treatment, for example a pre-oxidation: it has been noted that copper substrate surface quality influences the oxide layers formation, in term of chemical composition and crystalline form as well as in term of thickness.

Also pre-conditioning time (i.e. the time between the moment in which the copper article enters the alkaline bath and the moment in which it arrives in the applied electrical field) may be used for influence layer quality: when the pre-conditioning time is increased, final aspect and colour of the layers are improved.

BRIEF DESCRIPTION OF THE DRAWINGS

Further objects and advantages of the present invention will be apparent from the following description of non-limiting examples of the invention, with reference to the accompanying drawings, wherein:

FIGS. 2a, 2b, 3a, 3b, 4a, and 4b are SEM micrography pictures of three sample layers produced according to the method of the invention, showing their crystalline structures;

BEST MODE FOR CARRYING OUT THE INVENTION

Figure 1:
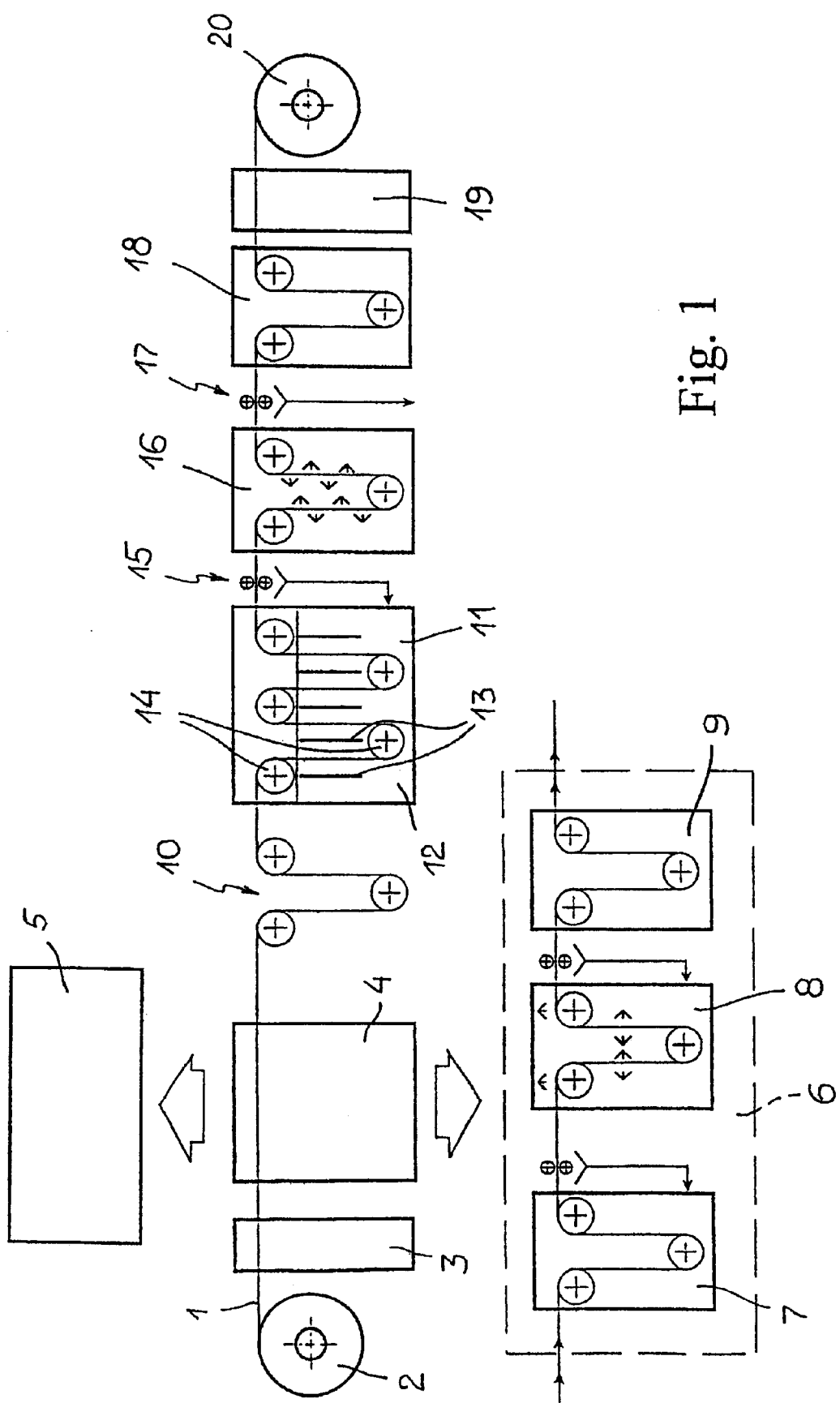
FIG. 1 schematically shows a preferred embodiment of an apparatus implementing the method according to the invention.

With reference to FIG. 1, according to a preferred embodiment of the method of the present invention, a copper or copper-base alloy strip 1, coiled onto an electrically insulated decoiler 2, has to be provided, on both side thereof, with an inorganic layer. The coiled strip 1, eventually after passing through a cutter/jointer unit 3, is sent to a known pretreatment unit 4, which may be a continuous furnace 5 for thermal pre-oxidation or a chemical pre-treatment unit 6, comprising a degreasing/pickling unit 7 and a spray rinsing unit 8 (both of them with a recovering of process fluid) followed by a drying unit 9. After the pre-treatment, which anyway is not necessary according to the present invention, the strip 1 is fed, through a conductive bridle 10 (for example comprising three metallic conductor rolls assuring the anodic electrical connection, which, according to a well known solution, are not directly grounded but connected to an earthing transformer), to an anodic cell 11 of a known type, for example comprising an electrically heated polypropylene tank, eventually provided with stirrers and containing an alkaline electrolytic bath 12; a number of pairs of parallel facing insoluble cathodes 13 (for example made of copper, platinum, platinum coated titanium or stainless steel) and of roller 14 are positioned in the cell 11, according to a well known disposition, in order to oxidize both faces of the strip 1: in order to produce a very uniform electric field and consequently assure the homogeneous colouring of both strip sides without border effects, each cathode has an homogeneous surface geometry. The distance between each of the cathodes 13 and the copper strip 1 (i.e. the anode) is preferably about 50 mm, but shorter or longer distances may be used without any deleterious effects. The cell 11 may be provided with a recovering system 15 of the electrolytic solution. After the anodizing process performed in the cell 11, the strip 1 passes through a spray rinsing unit 16, for example a high pressure water spray rinsing unit (also provided with a recovering system 17), a hot drying unit 18 and a mechanical cutter unit 19: finally, the strip 1 is coiled onto a coiler 20.

The present invention will be further described for better understanding in the following non-limiting examples.

EXAMPLE 1

Using the apparatus previously described and illustrated with reference to FIG. 1, a skin-passed "red" copper, benzotriazole inhibited, in coils 100 in. width×[0,6 in.] 1,524 cm thickness was treated according to the method of the invention. An electrolytic bath of NaOH 30% wt. in aqueous solution was used: the process and cell parameters are summarized in table I.

The bath was maintained under agitation during the whole anodizing process. Two copper cathodes were used, having an apparent cathodic surface of 1 $dm^2$ each and a known geometry capable to produce an uniform electric field. A very uniform and adherent layer was obtained (named CB2 for comparative purposes) having a dark brown colour.

TABLE I

| | |
|---|---|
| Electrolyte | $NaOH_{aq}$ 30% w/w |
| bath temperature | 80 ± 2° C. |
| anode-cathode distance | 50 mm |
| cell potential | 1.1 V |
| Current | 3.5 A |
| anodic current density | 2.75 $A/dm^2$ |
| contact time | 20 seconds |
| pre-conditioning time | 40 seconds |
| strip speed | 30 cm/min |

EXAMPLE 2

The same apparatus, cell and copper material of example 1 were used: the process and cell parameters are summarized in table II.

TABLE II

| | |
|---|---|
| Electrolyte | $NaOH_{aq}$ 30% w/w |
| bath temperature | 90 ± 2° C. |
| anode-cathode distance | 50 mm |
| cell potential | 0.65 V |
| Current | 1.0 A |
| anodic current density | 0.5 $A/dm^2$ |
| contact time | 20 seconds |
| pre-conditioning time | 40 seconds |
| strip speed | 30 cm/min |

A very uniform and adherent layer was obtained (named CB3 for comparative purposes) having a brown colour.

EXAMPLE 3

The same apparatus, cell and copper material of example 1 were used: the process and cell parameters are summarized in table III.

A very uniform and adherent layer was obtained (named CB4 for comparative purposes) having a deep black colour and velvety aspect.

TABLE III

| | |
|---|---|
| Electrolyte | $NaOH_{aq}$ 30% w/w |
| bath temperature | 90 ± 2° C. |
| anode-cathode distance | 50 mm |
| cell potential | 2 V |
| Current | 30 A |
| anodic current density | 15 $A/dm^2$ |
| contact time | 20 seconds |
| pre-conditioning time | 40 seconds |
| strip speed | 30 cm/min |

EXAMPLE 4

All samples produced in the above reported examples 1 to 3 were tested for determining chemical composition (by X-ray diffractometry and coulometry), thickness (by coulometric analysis performed by reducing the superficial copper oxide, at a constant current density, in a $Na_2CO_3$ 0.1 M solution, according to the method extensively described in A. Billi, E. Marinelli, L. Pedocchi, G. Rovida: "Surface characterization and corrosion behaviour of Cu—$Cu_2O$—CuO system", published on the Proceedings of the 11th

International Corrosion Congress, Florence, 1990, Vol. 5, p. 129, Edit Associazione Italiana di Metallurgia Milano, Italy 1990), crystalline structure (by SEM micrography and X-ray diffraction analysis): main test results are summarized in table IV.

TABLE IV

| | CEB2 | CEB3 | CEB4 |
|---|---|---|---|
| Chemical composition | $Cu_2O$ (traces of CuO) | $Cu_2O$ (traces of CuO) | $Cu_2O$ (traces of CuO) |
| Thickness (by coulometry) | 0.180 μm | 0.120 μm | 0.200 μm |
| Crystalline form | cubic | cubic | oriented needless |
| Colour | dark brown | brown | deep black |
| Aspect | very uniform, very adherent, non-pulverulent, non-velvety | very uniform, very adherent, non-pulverulent, non-velvety | uniform, adherent, velvet-like |

Figure 4A:
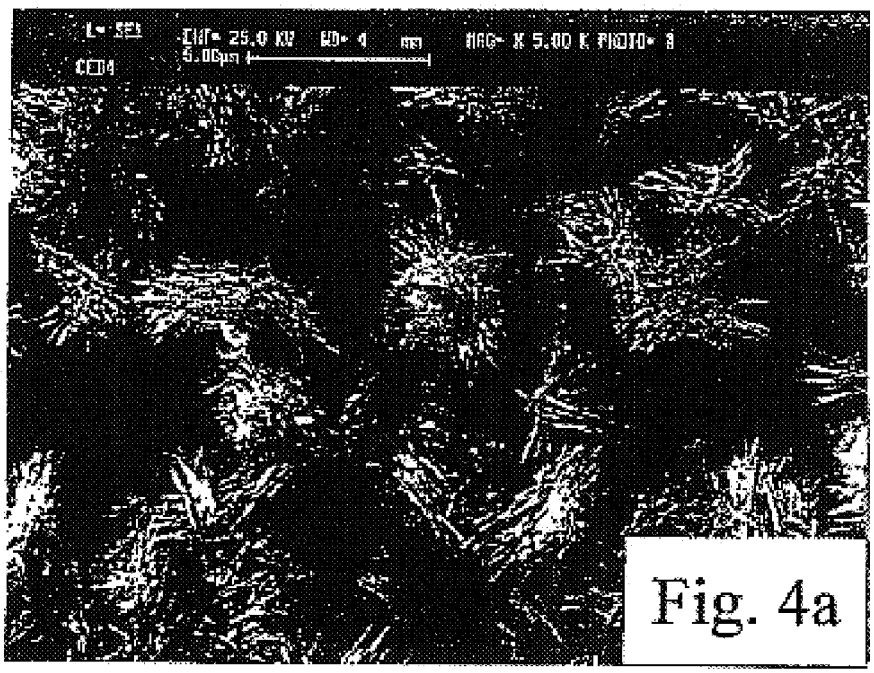
Figure 4B:
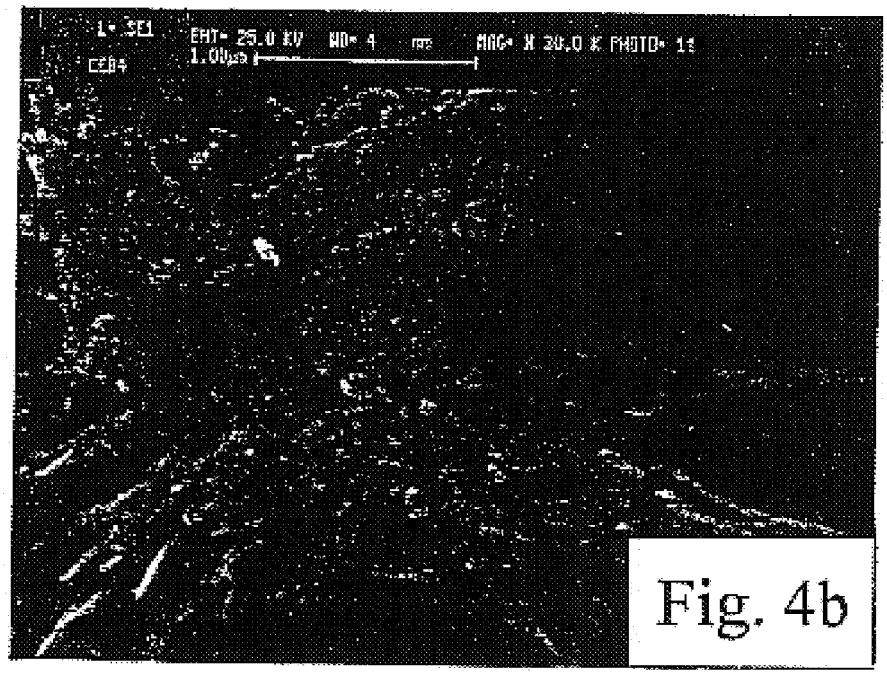

The crystalline form of layers according to the invention is shown in FIGS. 2 to 4, which are SEM micrography pictures of the three samples CEB2, CEB3 and CEB4 respectively.

Figure 5B:
FIGS. 5a, 5b are diagrams which graphically represents colour differences (evaluated according to ASTM E 308 and ISO 8125) among three sample layers produced according to the method of the invention and comparative samples.
Figure 5A:
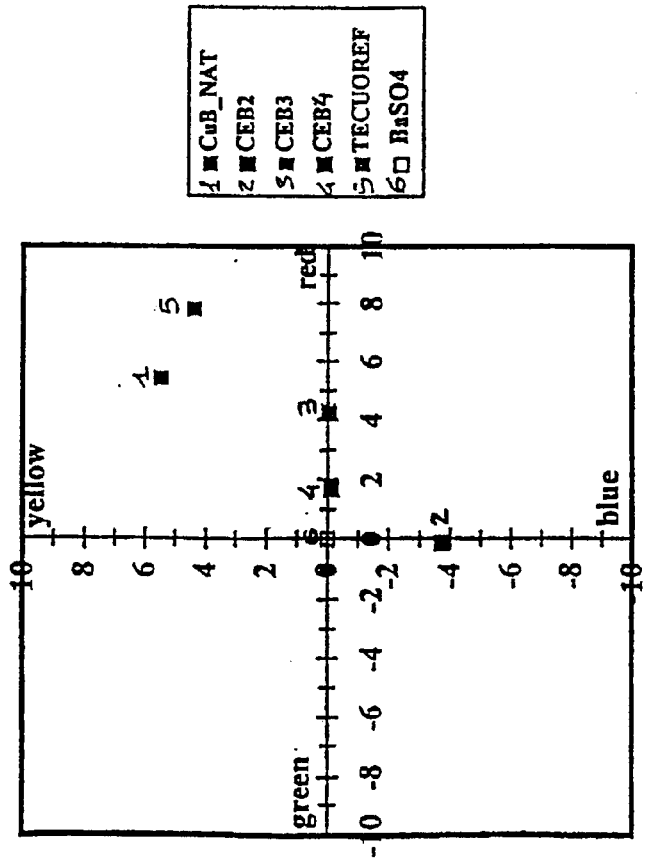
Figure 6:
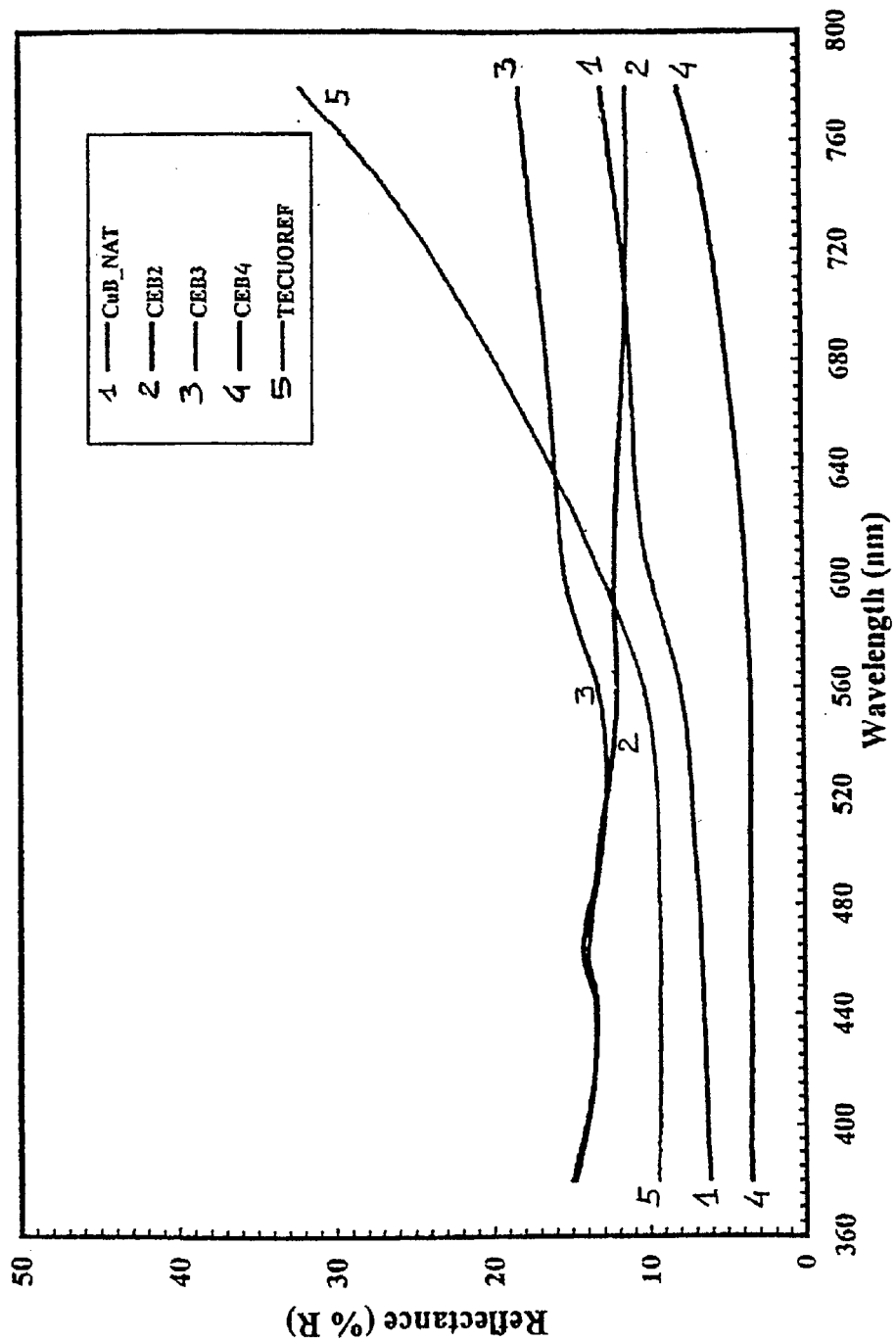
FIG. 6 is a graphic representation of reflectance measurements (according to ASTM E429) of three differently coloured layers according to the invention and comparative standard references.

Tests were conducted for evaluating optical properties too. A graphic representation of colour differences (evaluated according to ASTM E 308 and ISO 8125) among the samples obtained in example 1 to 3 and comparative samples is given in FIG. 5, where comparative standard references are: natural brown copper (after 10-year atmospheric exposure), named CuB_NAT; artificial browned copper (sheets, commercialized under the trademark Tecu-Oxid® and substantially produced according to the European Patent Application No. 751233), named TECUOREF; barium sulphate $BaSO_4$ (plates, white body). Reflectance measurements (according to ASTM E429) of the three differently coloured layers produced according to the invention and comparative standard references are reported in table V: a graphic representation of the same results is shown in FIG. 6.

TABLE V

| Sample | Ts | Ds | Ss | SRR | DRR |
|---|---|---|---|---|---|
| White body ref. ($BaSO_4$) | 98.16 | 98.16 | 0 | 0 | 100 |
| Black body ref. (velvet) | 1.24 | 1.05 | 0.19 | 15.32 | 84.68 |
| Black chromium on copper plate | 3.86 | 3.48 | 0.38 | 9.84 | 90.16 |
| TECUOREF (Tecu-Oxid ®) | 14.53 | 10.81 | 3.72 | 25.60 | 74.40 |
| Mirror | 131.25 | 17.05 | 114.2 | 87.00 | 13.00 |
| CEB2 (upper side) | 15.42 | 12.39 | 3.03 | 19.65 | 80.35 |
| CEB3 (upperside) | 14.96 | 13.96 | 1.00 | 6.68 | 93.32 |
| CEB4 (upper side) | 4.39 | 3.82 | 0.57 | 12.98 | 87.02 |

Legend:
Ts = Total reflectance
SRR = Specular reflectance Ratio (SRR = 100 × Ss/Ts)
Ds = Diffuse reflectance
Ss = Specular reflectance (Ss = Ts − Ds)
DRR = Diffuse reflectance Ratio (DRR = 100 × Ds/Ts)
Note:
reported values are referred to a conventional side ("upper side") of the samples: opposite side results (not reported) were substantially comparable with upper side values Gloss number measurements (according to ASTM D 523) of the three differently coloured layers according to the invention and comparative standard references are reported in table VI.

TABLE VI

| | gloss number for metallic materials | | gloss number for non-metallic materials |
|---|---|---|---|
| sample | at 20° | at 60° | at 20° |
| standard (ref.) | 1937 | 926 | 92.0 |
| CuB_NAT | 0 | 3 | 0.2 |
| CEB2 (upper side) | 11 | 55 | 16.1 |
| CEB3 (upper side) | 3 | 42 | 4.3 |
| CEB4 (upper side) | 0 | 2 | 0.0 |
| TECUOREF | 13 | 38 | 14.8 |

All samples produced by the method of the invention were also tested for evaluating their mechanical behaviour: relevant results are reported in table VII.

TABLE VII

| thickness | Coulometry | 0.100 ÷ 0.200 μm |
|---|---|---|
| adhesion | ASTM B 545/X4, B 571 | no flakes or cracks etc. after bending |
| flexibility-bending | ASTM B 545/X4.4 | no flakes or cracks etc. after bending |
| flexibility with conical mandrel | ASTM D 522 | no flakes or cracks etc. after bending |
| Erichsen ball punching | ASTM E 643, UNI 4693 | no flakes or cracks etc. after testing |
| deep-drawing | UNI 6124 | no flakes or cracks etc. after testing |
| welding | — | no problems, no preparation required |

Other tests were conducted according to the method of the invention, varying process conditions in order to evaluate the most effective controlling process parameters: this series of tests allows preferred process conditions (reported in table VIII) to be evaluated.

TABLE VIII

| electrolyte concentration | 1.25 ÷ 11.25 mole/l of hydroxyl ion (corresponding to 50 ÷ 450 g/l of NaOH or to 70 ÷ 630 g/l of KOH) |
|---|---|
| bath temperature | 60 ÷ 100° C. |
| anode-cathode distance | 30 ÷ 100 mm |
| cell potential | 0.2 ÷ 3.0 V |
| anodic current density | 0.3 ÷ 20 A/dm$^2$ |
| contact time | 5 ÷ 120 seconds |
| pre-conditioning time | 5 ÷ 180 seconds |
| $Cu_2O$ layer thickness | 0.100 ÷ 0.400 μm |

What is claimed is:

1. An electrochemical method for producing an inorganic covering layer on a surface of a copper or copper-based alloy element, said method comprising the steps of:
   (a) providing an electrolytic bath comprising a single alkali salt in aqueous solution, said bath having a concentration of about 1.25–11.25 mole/l of hydroxyl ion;
   (b) subjecting said element to anodic oxidation by placing said surface in the electrolytic bath under controlled process conditions of temperature and current density for a period of time suitable to form a continuous homogeneous layer of copper (I) oxide on said surface, wherein said layer has a thickness of 0.100–0.400 μm and a crystalline structure, and wherein said current density is applied in a range of 0.5–20 A/dm$^2$ to form the layer with a brown color, a dark brown color or a deep black color and a velvety surface effect.

2. The method according to claim 1, wherein said anodic oxidation is performed at a current density of 0.5–1 A/dm$^2$ to form the layer with a brown color.

3. The method according to claim 1, wherein said anodic oxidation is performed at a current density of 1.75–3 A/dm$^2$ to form the layer with a dark brown color.

4. The method according to claim 1, wherein said anodic oxidation is performed at a current density of 10–15 A/dm$^2$ to form the layer with a deep black color and a velvety surface effect.

5. A method according to claim 1, wherein said alkali salt in aqueous solution is sodium hydroxide (NaOH) at a concentration of about 50–450 g/l or potassium hydroxide (KOH) at a concentration of about 70–630 g/l.

6. A method according to claim 1, wherein said anodic oxidation is performed in a bath containing at last 20% wt. sodium hydroxide (NaOH) in aqueous solution, at a temperature of at least 60° C., at a current density of 0.5–20 A/dm$^2$ with a cell potential of 0.2–3 V and for a period of time of 5–120 seconds.

7. A method according to claim 6, wherein said anodic oxidation is performed in a bath of 30% wt. NaOH in aqueous solution, at a temperature of 82–02° C. and for a period of time of 10–30 seconds.

8. A method according to claim 1, wherein the method further comprises, before said anodic oxidation, a pre-treatment step of said surface.

9. A method according to claim 1, wherein the method further comprises, after said anodic oxidation, a final surface treatment.

10. A method according to claim 1, wherein said anodic oxidation starts as soon as said surface is placed in contact with said electrolytic bath.

11. A method according to claim 1, wherein said anodic oxidation starts at a period of time of 3–180 seconds after said surface is placed in contact with said electrolytic bath.

12. A method according to claim 1, wherein said surface and a second surface of said element are simultaneously subjected to said anodic oxidation.

13. The method according to claim 1, wherein said electrolytic bath consists essentially of said alkali salt and water.

14. The method according to claim 1, wherein the method consists essentially of said steps (a) and (b).

15. The method according to claim 1, wherein the method consists essentially of said steps (a) and (b) and, optionally, a pre-treatment of said surface before said anodic oxidation or a final surface treatment after said anodic oxidation.

\* \* \* \* \*